(12) United States Patent
Yokai et al.

(10) Patent No.: US 8,354,597 B2
(45) Date of Patent: Jan. 15, 2013

(54) WIRED CIRCUIT BOARD AND PRODUCING METHOD THEREROF

(75) Inventors: Takahiko Yokai, Osaka (JP); Toshiki Naito, Osaka (JP)

(73) Assignee: Nitto Denko Corporation, Osaka (JP)

( * ) Notice: Subject to any disclaimer, the term of this patent is extended or adjusted under 35 U.S.C. 154(b) by 739 days.

(21) Appl. No.: 12/216,511

(22) Filed: Jul. 7, 2008

(65) Prior Publication Data

US 2009/0008137 A1    Jan. 8, 2009

Related U.S. Application Data

(60) Provisional application No. 60/929,684, filed on Jul. 9, 2007.

(30) Foreign Application Priority Data

Jul. 5, 2007   (JP) .................. 2007-177510

(51) Int. Cl.
*H05K 1/03*      (2006.01)
*G11B 5/48*      (2006.01)
*H05K 1/00*      (2006.01)

(52) U.S. Cl. .................. 174/255; 360/245.9; 360/264.2; 361/751

(58) Field of Classification Search .................. 174/255, 174/251, 258; 360/245.8, 245.9; 361/748–803
See application file for complete search history.

(56) References Cited

U.S. PATENT DOCUMENTS

| | | | |
|---|---|---|---|
| 3,424,658 A | 1/1969 | Norton | |
| 6,882,506 B2 * | 4/2005 | Yamaoka et al. | 360/245.9 |
| 6,908,099 B2 * | 6/2005 | Andersen | 280/511 |
| 2002/0100609 A1 | 8/2002 | Ookawa et al. | |
| 2004/0252413 A1 * | 12/2004 | Nishiyama | 360/245.9 |
| 2006/0118330 A1 * | 6/2006 | Ooyabu et al. | 174/261 |
| 2006/0199402 A1 | 9/2006 | Ishii et al. | |
| 2007/0017695 A1 | 1/2007 | Ishii et al. | |
| 2007/0026726 A1 * | 2/2007 | Shin | 439/495 |
| 2009/0314525 A1 * | 12/2009 | Kajino et al. | 174/255 |

FOREIGN PATENT DOCUMENTS

| | | |
|---|---|---|
| JP | 6-326427 | 11/1994 |
| JP | 2002-222578 | 8/2002 |
| JP | 2005-11387 | 1/2005 |
| JP | 2006-245220 | 9/2006 |
| JP | 2006339365 A * | 12/2006 |
| JP | 2007-035868 | 2/2007 |

* cited by examiner

*Primary Examiner* — Zachary M Pape
(74) *Attorney, Agent, or Firm* — Jean C. Edwards, Esq.; Edwards Neils PLLC

(57) ABSTRACT

A wired circuit board includes a metal supporting board having at least one depressed portion, a conductive portion embedded in the at least one depressed portion and formed of a material having a higher conductivity than that of the metal supporting board, an insulating layer formed on the metal supporting board so as to cover the conductive portion, and a plurality of wires formed on the insulating layer in mutually spaced-apart relation so as to oppose to the conductive portion.

6 Claims, 4 Drawing Sheets

(a)

(b)

(c)

(d)

(e)

(f)

WIRED CIRCUIT BOARD AND PRODUCING METHOD THEREROF

CROSS-REFERENCE TO RELATED APPLICATIONS

This patent application claims the benefit of U.S. Provisional Application No. 60/929,684, filed on Jul. 9, 2007, and claims priority from Japanese Patent Application No. 2007-177510, filed on Jul. 5, 2007, the contents of which are herein incorporated by reference in their entirety.

BACKGROUND OF THE INVENTION

1. Field of the Invention

The present invention relates to a wired circuit board and a producing method thereof. More particularly, the present invention relates to a wired circuit board, such as a suspension board with circuit, and a producing method thereof.

2. Description of the Related Art

A hard disk drive is equipped with a suspension board with circuit on which a magnetic head is mounted. In a typical suspension board with circuit, an insulating layer made of a resin and a conductive pattern made of copper are formed in this order on a metal supporting board made of stainless steel.

In such a suspension board with circuit, since a metal supporting board is formed of stainless steel, a transmission loss in a conductive pattern is increased.

To reduce the transmission loss, it is proposed that an insulating layer is formed on a suspension made of stainless steel, a lower conductor made of copper or a copper alloy is formed on the insulating layer, and an insulating layer, a conductor of record-side and reproduction-side are formed in this order on the lower conductor (see, e.g., Japanese Unexamined Patent No. 2005-11387).

A suspension board with circuit is also proposed which includes a metal supporting board, a metal thin film formed on the metal supporting board, a metal foil formed on the metal thin film, an insulating layer formed on the metal foil, and a conductive pattern formed on the insulating layer (see, e.g., Japanese Unexamined Patent No. 2006-245220).

SUMMARY OF THE INVENTION

Each of the proposals mentioned above intends a reduced transmission loss in the conductive pattern is intended by forming the lower conductor over the suspension or forming the metal foil over the metal supporting board. However, the thickness of the wired circuit board is increased accordingly by the formation of the lower conductor or the metal foil.

The increased thickness of the wired circuit board is disadvantageous because it is against a lighter weight and a smaller thickness each required of the wired circuit board. In particular, a suspension board with circuit is for accurately holding a magnetic head in a position at a given angle and therefore needs highly accurate thickness control. When the thickness is increased as mentioned above, highly accurate thickness control becomes difficult to cause the degradation of the performance of a hard disk drive.

It is therefore an object of the present invention to provide a wired circuit board which allows a reduced transmission loss in a wire with a simple and easy structure without an increase in the thickness of the wired circuit board thereof.

A wired circuit board according to the present invention includes a metal supporting board having at least one depressed portion, a conductive portion embedded in the at least one depressed portion and formed of a material having a higher conductivity than that of the metal supporting board, an insulating layer formed on the metal supporting board so as to cover the conductive portion, and a plurality of wires formed on the insulating layer in mutually spaced-apart relation so as to oppose to the conductive portion.

In the wired circuit board according to the present invention, it is preferable that a plurality of the depressed portions are provided in mutually spaced-apart relation so as to correspond to the respective wires.

In the wired circuit board according to the present invention, it is also preferable that a single depressed portion is provided to correspond to all the wires.

In the wired circuit board according to the present invention, it is also preferable that the plurality of wires are provided in a plurality of pairs and a plurality of the depressed portions are provided in mutually spaced-apart relation so as to correspond to a pair of wires.

It is preferable that the wired circuit board according to the present invention is a suspension board with circuit.

A method of producing a wired circuit board according to the present invention includes preparing a metal supporting board, forming at least one depressed portion in the metal supporting board, embedding a conductive portion in the at least one depressed portion, the conductive portion being formed of a material having a higher conductivity than that of the metal supporting board, and forming an insulating layer on the metal supporting board so as to cover the conductive portion and forming a plurality of wires on the insulating layer in mutually spaced-apart relation so as to oppose to the conductive portion.

In the wired circuit board produced by the method of producing a wired circuit board according to the present invention, the conductive portion having a higher conductivity than that of the metal supporting board is embedded in the depressed portion of the metal supporting board. Therefore, a transmission loss in the plurality of wires opposed to the conductive portion can be reduced. In addition, since the conductive portion is embedded in the depressed portion of the metal supporting board, the thickness of the wired circuit board can be reduced compared with the case where the conductive portion is formed on the metal supporting board. As a result, it is possible to reduce a transmission loss in the wires with a simple and easy structure without increase in the thickness of the wired circuit board.

DETAILED DESCRIPTION OF THE INVENTION

Figure 1:
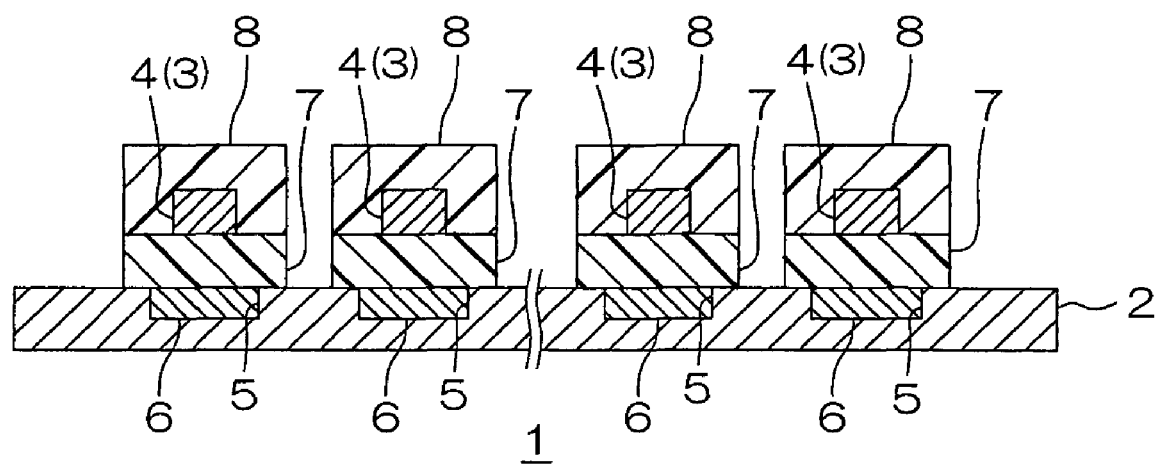
FIG. 1 is a cross-sectional view showing a principal portion of a suspension board with circuit as an embodiment of a wired circuit board according to the present invention.

FIG. 1 is a cross-sectional view showing a principal portion of a suspension board with circuit as an embodiment of a wired circuit board according to the present invention. In addition, FIG. 1 is a cross-sectional view showing a principal portion of a suspension board with circuit 1 in a widthwise direction perpendicular to the longitudinal direction thereof.

The suspension board with circuit 1 is integrally formed with a conductive pattern 3 on a metal supporting board 2 extending in the longitudinal direction. The conductive pattern 3 includes a plurality of wires 4 extending along the longitudinal direction of the metal supporting board 2 and terminal portions (not shown) provided on both the end portions of the wires 4.

The suspension board with circuit 1 is mounted on a hard disk drive. A magnetic head is mounted on one longitudinal end portion of the metal supporting board 2 to be electrically connected to one of the terminal portions of the conductive pattern 3. A read/write board is electrically connected to the other terminal portion of the conductive pattern 3. A read signal read from a hard disk by the magnetic head is transmitted from the magnetic head to the read/write board via the one terminal portion, the wires 4, and the other terminal portion. A write signal to be written into the hard disk from the read/write board is transmitted from the read/write board to the magnetic head via the other terminal portion, the wires 4, and the one terminal portion and written into the hard disk by the magnetic head.

In FIG. 1, the suspension board with circuit 1 includes the metal supporting board 2 having depressed portions 5, conductive portions 6 embedded in the depressed portions 5, insulating base layers 7 as an insulating layer formed on the metal supporting board 2 so as to cover the conductive portions 6, the conductive pattern 3 formed on the insulating base layers 7, and insulating cover layers 8 formed on the insulating base layers 7 so as to cover the conductive pattern 3.

The metal supporting board 2 is formed of a metal foil or a metal thin plate into a flat plate shape. The metal supporting board 2 is shaped into the outer shape of the suspension board with circuit 1 and extends in the longitudinal direction. Examples of a metal for forming the metal supporting board 2 include stainless steel, copper, a copper alloy, and a 42-alloy. Preferably, stainless steel or a copper alloy is used. The thickness of the metal supporting board 2 is in the range of, e.g., 10 to 50 μm, or preferably 15 to 25 μm.

The plurality of depressed portions 5 are formed in the metal supporting board 2. The depressed portions 5 are arranged in the metal supporting board 2 to be spaced apart from each other in the widthwise direction and correspondingly opposed to the respective wires 4 in a thickness direction. The depressed portion 5 is formed in a long trench shape extending along the longitudinal direction of the metal supporting board 2. The depressed portion 5 is formed in a generally depressed cross-sectional shape (generally rectangular cross-sectional shape) which is depressed halfway from the surface of the metal supporting board 2 toward the back surface thereof in the thickness direction. The width (widthwise length) of the depressed portion 5 is one to ten times the width of the wire 4 and in the range of, e.g., 10 to 150 μm, or preferably 20 to 120 μm. The spacing between the individual depressed portions 5 is ¼ to ½ times the spacing between the individual wires 4 and in the range of, e.g., 5 to 150 μm, or preferably 20 to 60 μm. The depth (length in the thickness direction) of the depressed portion 5 is in the range of, e.g., not more than 8 μm, preferably 1 to 6 μm, or more preferably 2 to 4 μm.

The conductive portions 6 are embedded in the respective depressed portions 5. That is, the plurality of conductive portions 6 are arranged in the metal supporting board 2 so as to be spaced apart from each other in the widthwise direction and opposed to the respective wires 4 in the thickness direction. The conductive portion 6 is formed in a generally depressed cross-sectional shape (generally rectangular cross-sectional shape) extending along the longitudinal direction of the metal supporting board 2 and filled halfway from the surface of the metal supporting board 2 toward the back surface thereof in the thickness direction. The conductive portions 6 are filled in the respective depressed portions 5 to be substantially flush with the surface of the metal supporting board 2.

The conductive portions 6 are formed of a material having a higher conductivity than that of the metal supporting board 2. Examples of such a material used to form the conductive portions 6 include copper, silver, nickel, gold, a solder, or an alloy thereof. When the metal supporting board 2 is formed of, e.g., stainless steel or a copper alloy, copper or silver is preferably used as a material for forming the conductive portions 6.

The plurality of insulating base layers 7 are provided on the metal supporting board 2 so as to be spaced apart from each other in the widthwise direction and opposed to the respective wires 4 in the thickness direction. The insulating base layer 7 is formed to extend along the longitudinal direction of the metal supporting board 2 so as to cover the conductive portions 6 at the surface of the metal supporting board 2. The insulating base layer 7 is formed in a generally rectangular cross-sectional shape. The width (widthwise length) of the insulating base layer 7 is one to ten times the width of the depressed portion 5 and in the range of, e.g., 10 to 400 μm, or preferably 20 to 180 μm. The spacing between the individual insulating base layers 7 is ¼ to ½ times the spacing between the individual depressed portions 5 and in the range of, e.g., 5 to 150 μm, or preferably 20 to 80 μm. The thickness of the insulating base layer 7 is in the range of 1 to 15 μm, or preferably 1 to 10 μm.

Examples of an insulator used to form the insulating base layers 7 include synthetic resins such as polyimide, polyether nitrile, polyether sulfone, polyethylene terephthalate, polyethylene naphthalate, and polyvinyl chloride. Among these synthetic resins, a photosensitive synthetic resin is used preferably, or more preferably photosensitive polyimide is used.

As described above, the conductive pattern 3 includes the plurality of wires 4 and the terminal portions (not shown). The plurality of wires 4 are provided on the surfaces of the insulating base layers 7 so as to be spaced apart from each other in the widthwise direction and opposed to the respective conductive portions 6 and the respective insulating base layers 7 in the thickness direction.

Among the plurality of wires 4, two wires 4 adjacent to each other are provided on one widthwise side as a pair of read-signal wires for transmitting the read signal mentioned above. Other two wires 4 adjacent to each other are provided on the other widthwise side as a pair of write-signal wires for transmitting the write signal mentioned above.

The individual wires 4 extend along the longitudinal direction of the metal supporting board 2 and are connected to the terminal portions at both end portions. The width of the wire 4 is in the range of, e.g., 10 to 100 μm, or preferably 20 to 50 μm. The spacing between the individual wires 4 is in the range of, e.g., 15 to 100 μm, or preferably 20 to 50 μm. The thickness of the wire 4 is in the range of, e.g., 5 to 20 μm, or preferably 7 to 15 μm.

Examples of a conductor used to form the conductive pattern 3 include copper, nickel, gold, a solder, or an alloy thereof. Among them, copper is preferably used.

The insulating cover layers 8 are individually formed to correspond to the respective insulating base layers 7. The insulating cover layers 8 are each formed on the surfaces of the respective insulating base layers 7 so as to cover the respective wires 4. The insulating cover layer 8 has openings (not shown) formed to expose both the terminal portions. The thickness of the insulating cover layer 8 is in the range of, e.g., 2 to 10 μm, or preferably 3 to 6 μm. As an insulator for forming the insulating cover layers 8, the same insulator as used for the insulating base layers 7 mentioned above is used.

Figure 2:
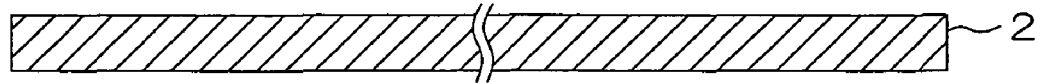
FIG. 2 is a production process view showing a method of producing the suspension board with circuit shown in FIG. 1,
  (a) showing the step of preparing a metal supporting board,
  (b) showing the step of laminating etching resists on the metal supporting board,
  (c) showing the step of processing the etching resist into a pattern reverse to an arrangement pattern of depressed portions,
  (d) showing the step of etching the surface of the metal supporting board exposed from the etching resist to form the depressed portions,
  (e) showing the step of embedding conductive portions in the depressed portions, and
  (f) showing the step of removing the etching resists.
Figure 2:
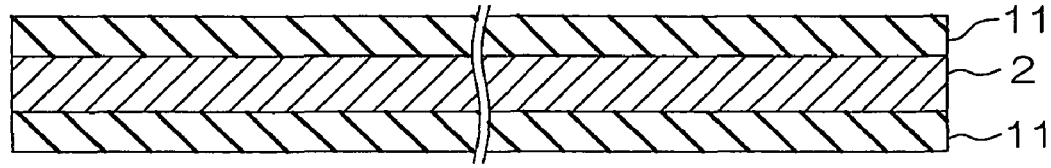
Figure 2:
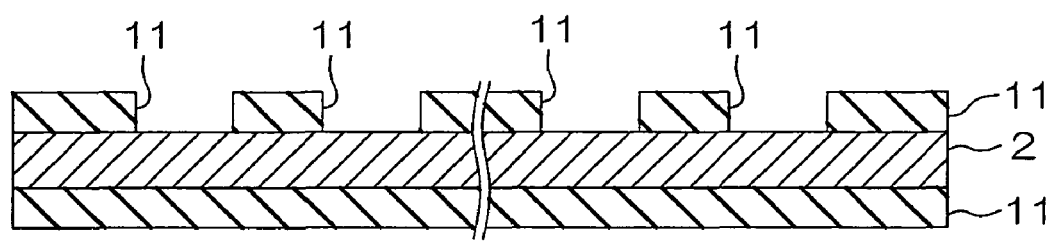
Figure 2:
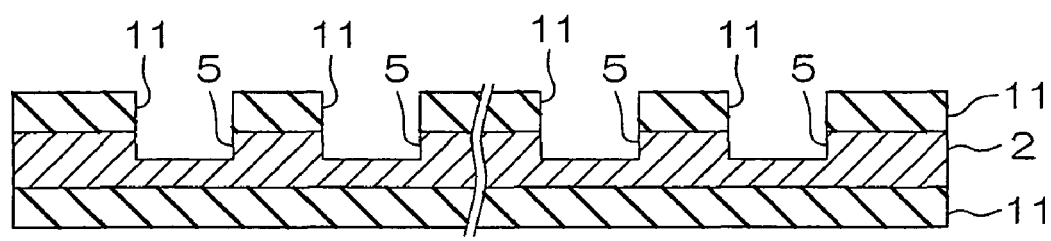
Figure 2:
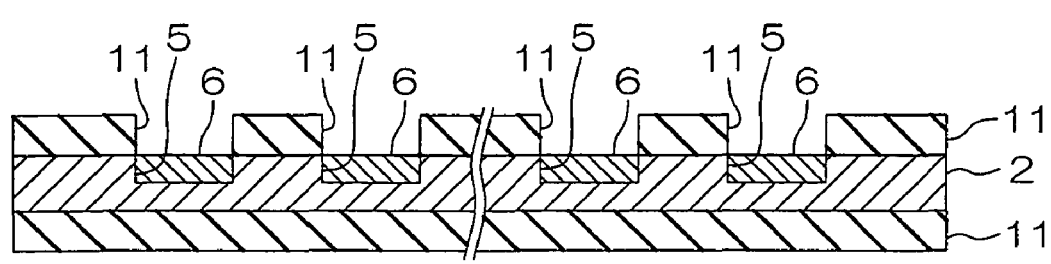
Figure 2:
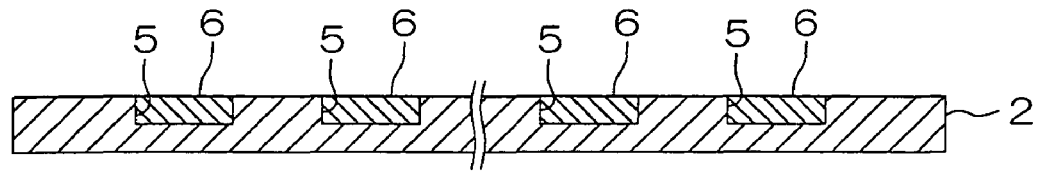
Figure 3:
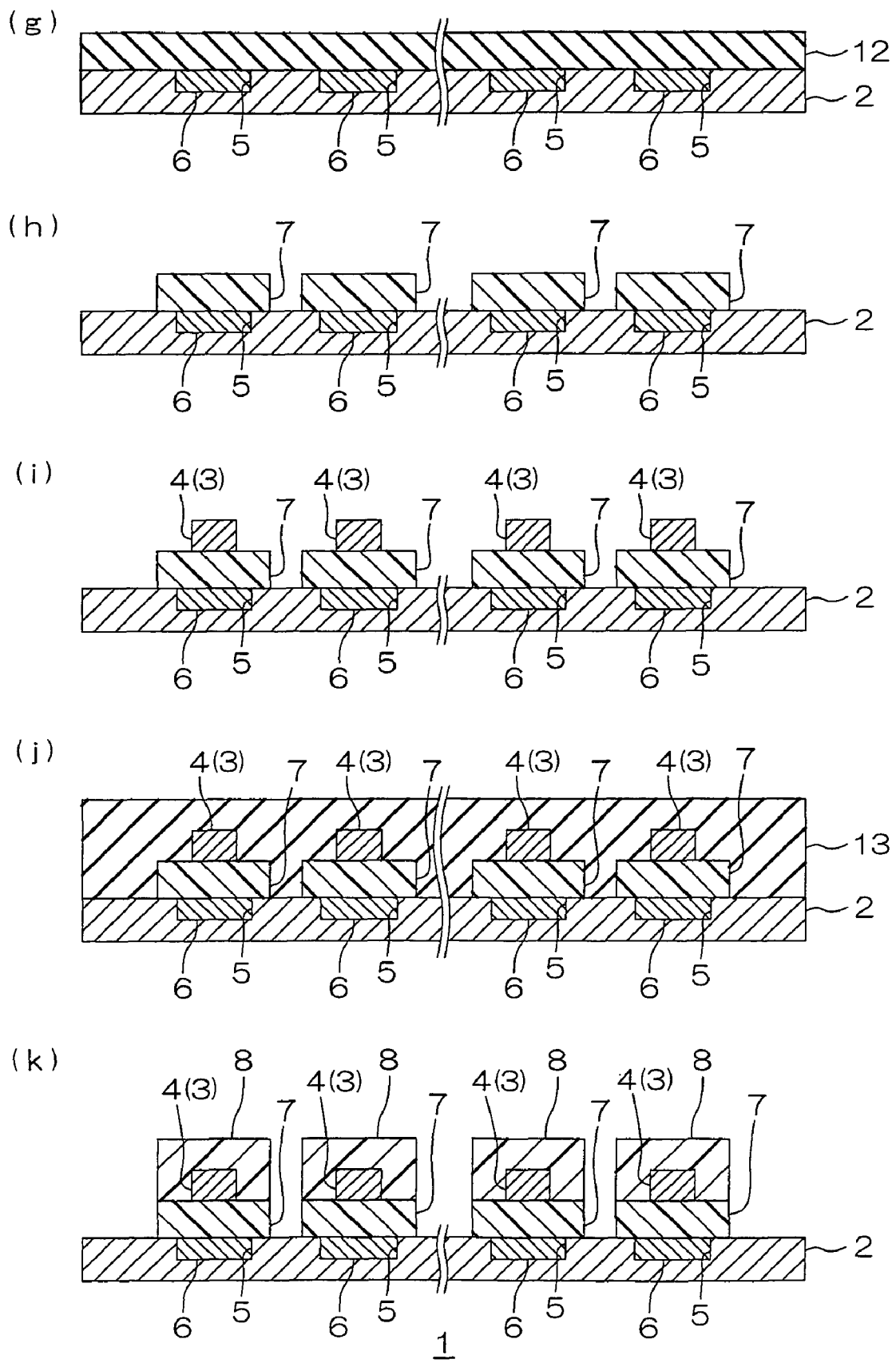
FIG. 3 is a production process view showing the method of producing the suspension board with circuit shown in FIG. 1, subsequently to FIG. 2, (g) showing the step of forming a precursor layer on the surfaces of the conductive portions and on the surface of the metal supporting board, (h) showing the step of developing the precursor layer after exposure to light with a pattern to form insulating base layers, (i) showing the step of forming a conductive pattern on the insulting base layers, (j) showing the step of forming a precursor layer on the surfaces of wires, on the surfaces of the insulating base layers, and on the surface of the metal supporting board, and (k) showing the step of developing the precursor layer after exposure to light with a pattern to form insulating cover layers.

Next, a description is given to a method of producing the suspension board with circuit with reference to FIGS. 2 and 3.

First, as shown in FIG. 2(a), the metal supporting board 2 is prepared in the method.

Next, as shown in FIG. 2(b), etching resists 11 are laminated on the surface and the back surface of the metal supporting board 2. For the etching resists 11, a known material made of a dry film resist is used.

Then, as shown in FIG. 2(c), the etching resist 11 formed on the surface of the metal supporting board 2 is processed into a pattern reverse to an arrangement pattern of the depressed portions 5. For the processing, known photoprocessing is used by which the etching resist 1 is exposed to light with a pattern, and then developed.

Next, as shown in FIG. 2(d), the surface of the metal supporting board 2 exposed from the etching resist 11 is etched to form the plurality of depressed portions 5 in the metal supporting board 2. For the etching, a known method (wet etching method) using an etching solution, such as a dipping method or a spraying method, is used. As the etching solution, an acidic chemical solution of, e.g., ferric chloride, a hydrogen peroxide-sulfuric acid solution mixture, ammonium persulfate, sodium persulfate, or the like is used.

Then, as shown in FIG. 2(e), the conductive portions 6 are embedded in the respective depressed portions 5. To embed the conductive portions 6 in the respective depressed portions 5, e.g., a material mentioned above for forming the conductive portions 6 is used and precipitated in each of the depressed portions 5 by plating such as electrolytic plating or electroless plating. Alternatively, a paste of a material mentioned above for forming the conductive portions 6 is formed and coated by printing. Otherwise, an ink of a material mentioned above for forming the conductive portions 6 is formed and coated by an inkjet method. When the metal supporting board 2 is formed of stainless steel or a copper alloy, electrolytic plating or electroless plating is preferably used.

As a result, the conductive portions 6 are filled in the respective depressed portions 5 with no space formed therebetween to be substantially flush with the surface of the metal supporting board 2.

Then, as shown in FIG. 2(f), the etching resists 11 are removed by etching or stripping.

Then, as shown in, e.g., FIGS. 3(g) and 3(h), the insulating base layers 7 are formed on the metal supporting board 2 so as to cover the conductive portions 6.

That is, as shown in FIG. 3(g), a varnish of a photosensitive synthetic resin (e.g., a varnish of a photosensitive polyamic acid resin) for forming the insulating base layers 7 is first coated on the surfaces of the conductive portions 6 and on the surface of the metal supporting board 2, and then dried to form a precursor layer 12.

Then, as shown in FIG. 3(h), the precursor layer 12 is exposed to light with a pattern, and then developed to form into the pattern of the respective insulating base layers 7 corresponding to the respective conductive portions 6, which is then cured by heating as necessary to form the insulating base layers 7.

Alternatively, it is also possible to cover the conductive portions 6 with a barrier layer, such as a metal thin film, prior to the formation of the insulating base layers 7 and form the insulating base layers 7 on the conductive portions 6 through the barrier layer.

Next, as shown in FIG. 3(i), the conductive pattern 3 is formed on the insulating base layers 7. The conductive pattern 3 is formed by a patterning method such as, e.g., an additive method or a subtractive method. Preferably, the conductive pattern 3 is formed by the additive method.

That is, in the additive method, a metal thin film (seed film) is first formed on the surfaces of the insulating base layers 7 and on the surface of the metal supporting board 2 exposed from the insulating base layers 7 by sputtering, electrolytic plating, electroless plating, or the like. Then, a dry film resist is laminated on the surface of the metal thin film, exposed to light, and developed to form a plating resist in a pattern reverse to the conductive pattern 3. The conductive pattern 3 is formed by electrolytic plating on the surface of the metal thin film exposed from the plating resist. Thereafter, the plating resist and the metal thin film on the portion where the plating resist is formed are removed by etching or the like. In this manner, the conductive pattern 3 is formed as a pattern including the plurality of wires 4 and the terminal portions. The individual wires 4 are formed so as to be spaced apart in the widthwise direction and opposed to the respective conductive portions 6 in the thickness direction.

Thereafter, as shown in FIGS. 3(j) and 3(k), the insulating cover layers 8 are formed on the insulating base layers 7 so as to cover the conductive pattern 3.

That is, as shown in FIG. 3(j), a varnish of a photosensitive resin (e.g., a varnish of a photosensitive polyamic acid resin) for forming the insulating cover layers 8 is first coated on the surfaces of the wires 4, on the surfaces of the insulating base layers 7 exposed from the wires 4, and on the surface of the metal supporting board 2 exposed from the insulating base layers 7, and then dried to form a precursor layer 13.

Then, as shown in FIG. 3(k), the precursor layer 13 is exposed to light with a pattern, and then developed to form into a pattern in which the precursor layer 13 is laminated on each of the insulating base layers 7, which is then cured by heating as necessary to form the insulating cover layers 8. As a result, the suspension board with circuit 1 is obtained.

In the suspension board with circuit 1, the conductive portions 6 are embedded in the respective depressed portions 5 of the metal supporting board 2. This allows a reduced transmission loss in the individual wires 4 opposed to the respective conductive portions 6.

In addition, the individual conductive portions 6 are embedded in the respective depressed portions 5 of the metal supporting board 2. Therefore, compared with the case where the conductive portions 6 are formed on the surface of the metal supporting board 2, the thickness of the suspension board with circuit 1 can be reduced, and a transmission loss in the wires 4 can be reduced with a simple and easy structure without increase in the thickness of the suspension board with circuit 1. This allows highly accurate thickness control of the suspension board with circuit 1. As a result, it is possible to accurately hold the magnetic head in an position at a given angle and ensure excellent long-term reliability.

Moreover, the individual conductive portions 6 are embedded in the respective depressed portions 5 of the metal supporting board 2 to be substantially flush with the surface of the metal supporting board 2. Therefore, the surface of the insulating base layers 7 formed on the surfaces of the conductive portions 6 and on the surface of the metal supporting board 2 can be formed with high smoothness. As a result, it is possible to stabilize the shape of the conductive pattern 3 formed on the surfaces of the insulating base layers 7.

Further, in accordance with the method described above, it is unnecessary to form an insulating layer on a suspension, like on the suspension described in Japanese Unexamined Patent 2005-11387, and it is also unnecessary to form a metal thin film for providing adhesion between a metal supporting board and a metal foil, like in the suspension board with circuit described in Japanese Unexamined Patent 2006-245220. This achieves a reduction in production cost.

Additionally, since the depressed portions 5 are formed in the metal supporting board 2 to correspond to the individual wires 4 in accordance with the method described above, the conductive portions 6 and the wires 4 can be easily opposed to each other in the thickness direction. This allows accurate positioning of the individual conductive portions 6 and the wires 4 relative to each other in the thickness direction and allows easy and reliable positioning of the individual conductive portions 6 in correspondence to the respective wires 4 in accordance with the design of electric characteristics.

Figure 4:
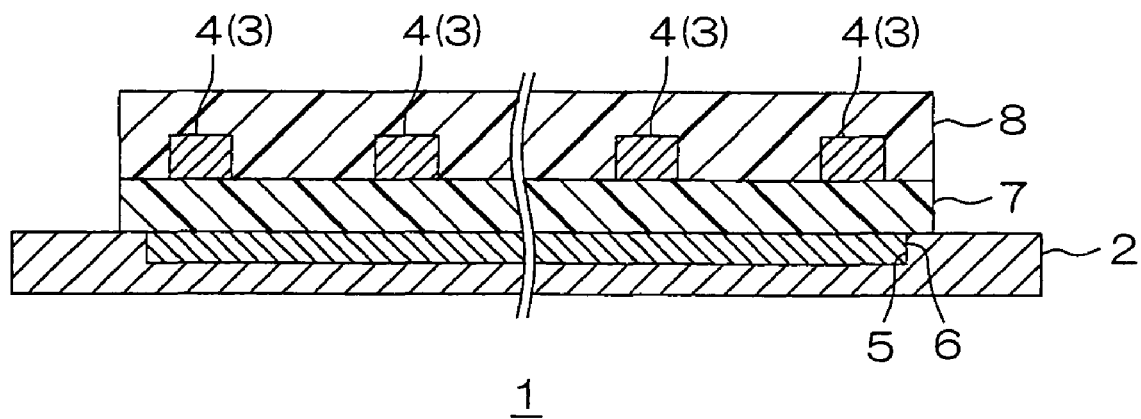
FIG. 4 is a cross-sectional view showing a principal portion of a suspension board with circuit as another embodiment (in which the single depressed portion is formed to correspond to all the wires) of the wired circuit board according to the present invention.

In the description given above, the plurality of depressed portions 5 are formed in mutually spaced-apart relation in the metal supporting board 2 so as correspond to the respective wires 4. However, it is also possible to, e.g., form a single depressed portion 5 in the metal supporting board 2 such that the depressed portion 5 is elongated in the widthwise direction to correspond to all the wires 4, as shown in FIG. 4. The members shown in FIG. 4 which are the same as the members described above are provided with the same reference numerals and a description thereof is omitted.

In FIG. 4, the depressed portion 5 is disposed in the metal supporting board 2 to be elongated in the widthwise direction and opposed to all the wires 4 in the thickness direction. The depressed portion 5 is formed in a long trench shape extending along the longitudinal direction of the metal supporting board 2. The width (widthwise length) of the depressed portion 5 is in the range of, e.g., 60 to 800 μm, or preferably 100 to 300 μm.

The conductive portion 6 is embedded in the depressed portion 5. That is, a single conductive portion 6 is embedded also to be elongated in the width direction and opposed to all the wires 4 in the thickness direction. The conductive portion 6 is filled in the depressed portion 5 to be substantially flush with the surface of the metal supporting board 2, in the same manner as described above.

In the suspension board with circuit 1 shown in FIG. 4, a single insulating base layer 7 and a single insulating cover layer 8 are also formed to be elongated in the widthwise direction and opposed to all the wires 4 in the thickness direction.

The suspension board with circuit 1 shown in FIG. 4 can be produced in accordance with the method shown in FIGS. 2 and 3 as follows. That is, in the step shown in FIG. 2(c), the etching resist 11 formed on the surface of the metal supporting board 2 is processed into a pattern reverse to that of the widthwise elongated depressed portion 5 mentioned above. In the step shown in FIG. 2(d), the surface of the metal supporting board 2 exposed from the etching resist 11 is etched to form the widthwise elongated single depressed portion 5 in the metal supporting board 2.

Then, in the step shown in FIG. 2(e), the widthwise elongated single conductive portion 6 is filled in the depressed portion 5. In the step shown in FIG. 2(f), the etching resist 11 is removed.

Then, in accordance with the method shown in FIG. 3, the insulating base layer 7, the conductive pattern 3, and the insulating cover layer 8 are formed in this order, whereby the suspension board with circuit 1 shown in FIG. 4 is obtained.

In the suspension board with circuit 1 shown in FIG. 4, the single depressed portion 5, the single conductive portion 6, the single insulating base layer 7, and the single insulating cover layer 8 are each formed to be elongated in the widthwise direction and opposed to all the wires 4 in the thickness direction. This can simplify the production process steps.

It is also possible to provide a plurality of the depressed portions 5 in mutually spaced-apart relation such that each depressed portion 5 corresponds to a pair of wires 4. The members shown in FIG. 5 which are the same as the members described above are provided with the same reference numerals and a description thereof is omitted.

Figure 5:
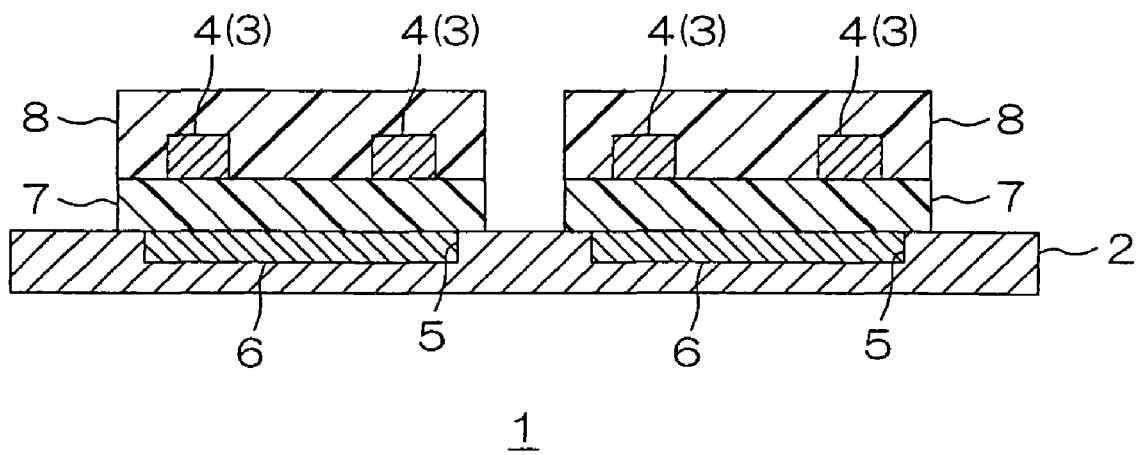
FIG. 5 is a cross-sectional view showing a principal portion of a suspension board with circuit as still another embodiment (in which a plurality of the depressed portions are formed such that each depressed portion corresponds to a pair of wires) of the wired circuit board according to the present invention.

In FIG. 5, two depressed portions 5 are provided in mutually spaced-apart relation on both widthwise sides. Specifically, one of the depressed portions 5 is provided on one widthwise side to be opposed to two wires 4 provided as a pair of read-signal wires on one widthwise side in the thickness direction, while the other depressed portion 5 is provided on the other widthwise side to be opposed to the other two wires 4 provided as a pair of write-signal wires on the other widthwise side in the thickness direction. The width (widthwise length) of the depressed portion 5 is in the range of, e.g., 30 to 400 μm, or preferably 50 to 150 μm.

The conductive portions 6 are embedded in the respective depressed portions 5. That is, one of the conductive portions 6 is also embedded in the depressed portion 5 provided on one widthwise side to be opposed to the two wires 4 provided as the pair of read-signal wires on one widthwise side in the thickness direction, while the other conductive portion 6 is also embedded in the depressed portion 5 provided on the other widthwise side to be opposed to the two wires 4 provided as a pair of write-signal wires on the other widthwise side in the thickness direction. The conductive portions 6 are filled in the depressed portions 5 to be substantially flush with the surface of the metal supporting board 2, in the same manner as described above.

In the suspension board with circuit 1 shown in FIG. 5, two insulating base layers 7 and two insulating cover layers 8 are also provided in mutually spaced apart relation on both widthwise sides to be opposed to two pairs of wires 4 in the thickness direction.

The suspension board with circuit 1 shown in FIG. 5 can be produced in accordance with the method shown in FIGS. 2 and 3 as follows. That is, in the step shown in FIG. 2(*c*), the etching resist 11 formed on the surface of the metal supporting board 2 is processed into a pattern reverse to that of the two depressed portions 5 provided in mutually spaced-apart relation on both the widthwise sides. In the step shown in FIG. 2(*d*), the surface of the metal supporting board 2 exposed from the etching resist 11 is etched to form the two depressed portions 5 in mutually spaced-apart relation on both the widthwise sides of the metal supporting board 2.

Then, in the step shown in FIG. 2(*e*), the conductive portions 6 are filled in the respective depressed portions 5. In the step shown in FIG. 2(*f*), the etching resist 11 is removed.

Then, in accordance with the method shown in FIG. 3, the insulating base layers 7, the conductive pattern 3, and the insulating cover layers 8 are formed in this order, whereby the suspension board with circuit 1 shown in FIG. 5 is obtained.

In the suspension board with circuit 1 shown in FIG. 5, each depressed portion 5, the conductive portion 6, the insulating base layer 7, and the insulating cover layers 8 are formed to be opposed to each one pair of the wires 4 (the pair of read-signal wires or the pair of write-signal wires) in the thickness direction. Therefore, even when the read signal and the write signal are differential signals, a transmission loss in the wire 4 can be sufficiently reduced.

While the illustrative embodiments of the present invention are provided in the above description, such is for illustrative purpose only and it is not to be construed limitative. Modification and variation of the present invention that will be obvious to those skilled in the art is to be covered by the following claims.

What is claimed is:

1. A wired circuit board comprising:
    a metal supporting board having at least one depressed portion and comprising a metal foil formed of stainless steel and having a thickness in the range of 10-50 µm, the at least one depressed portion having a depth of not more than 8 µm;
    a conductive portion embedded in the at least one depressed portion and formed of copper which is a material having a higher conductivity than that of the metal supporting board;
    an insulating layer formed on the metal supporting board so as to cover the conductive portion; and
    a plurality of wires formed on the insulating layer in mutually spaced-apart relation so as to oppose to the conductive portion.

2. The wired circuit board according to claim 1, wherein the at least one depressed portion comprises a plurality of depressed portions which are provided in mutually spaced-apart relation so as to correspond to the respective wires.

3. The wired circuit board according to claim 1, wherein the at least one depressed portion is provided as a single depressed portion to correspond to all the wires.

4. The wired circuit board according to claim 1, wherein the plurality of wires are provided in a plurality of pairs and the at least one depressed portion comprises a plurality of depressed portions which are provided in mutually spaced-apart relation so as to correspond to a pair of wires.

5. The wired circuit board according to claim 1, wherein the wired circuit board is a suspension board with circuit.

6. A method of producing a wired circuit board, the method comprising:
    preparing a metal supporting board comprising a metal foil formed of stainless steel and having a thickness in the range of 10-50 µm;
    forming at least one depressed portion in the metal supporting board, the at least one depressed portion having a depth of not more than 8 µm;
    embedding a conductive portion in the at least one depressed portion, the conductive portion being formed of copper which is a material having a higher conductivity than that of the metal supporting board;
    forming an insulating layer on the metal supporting board so as to cover the conductive portion; and
    forming a plurality of wires on the insulating layer in mutually spaced-apart relation so as to oppose to the conductive portion.

* * * * *